(12) United States Patent
Utsugi et al.

(10) Patent No.: US 6,811,809 B2
(45) Date of Patent: Nov. 2, 2004

(54) ORGANIC ELECTROLUMINESCENT DEVICE AND METHOD FOR FABRICATING SAME

(75) Inventors: Koji Utsugi, Tokyo (JP); Masashi Tamegai, Tokyo (JP)

(73) Assignee: Samsung SDI Co., Ltd., Suwon (KR)

( * ) Notice: Subject to any disclaimer, the term of this patent is extended or adjusted under 35 U.S.C. 154(b) by 8 days.

(21) Appl. No.: 10/164,418

(22) Filed: Jun. 10, 2002

(65) Prior Publication Data

US 2002/0150674 A1 Oct. 17, 2002

Related U.S. Application Data

(62) Division of application No. 09/835,410, filed on Apr. 17, 2001, now Pat. No. 6,627,332.

(30) Foreign Application Priority Data

Apr. 17, 2000 (JP) ........................................ 2000-115377

(51) Int. Cl.[7] ............................ B05D 5/12; C23C 14/04
(52) U.S. Cl. ........................................ 427/66; 427/282
(58) Field of Search .................................... 427/66, 282

(56) References Cited

U.S. PATENT DOCUMENTS 4,511,599 A * 4/1985 Rustomji ..................... 427/66
6,107,734 A * 8/2000 Tanaka et al. ............... 313/506
6,294,892 B1 * 9/2001 Utsugi et al. ................ 318/640

FOREIGN PATENT DOCUMENTS

JP          10-365552          3/2000

OTHER PUBLICATIONS

JPO Machine translation of JP 10–365552.*

Kusaka et al., "Development of Multi–Color Organic EL Display", The NEC Technical Journal, vol. 51, No. 10, 1998, pp. 28–32, (no month available).

Extended abstracts of 9th International Workshop on Inorganic and Organic Electroluminescence, Sep. 14–17, 1998, pp. 137–140.

* cited by examiner

Primary Examiner—Michael Cleveland
(74) Attorney, Agent, or Firm—McGuireWoods LLP

(57) ABSTRACT

An organic EL device including: a substrate; a pair of electrodes having electrode lines and overlying the substrate; and an organic film including at least one light emitting layer disposed between the electrodes, wherein the electrode lines are formed by overlapping part of the electrodes. In the present invention, the minute electrode lines as small as 100 $\mu$m pitch can be formed by vacuum evaporation by use of a patterning mask (metal mask).

4 Claims, 12 Drawing Sheets

APERPURES

APERPURES

ORGANIC ELECTROLUMINESCENT DEVICE AND METHOD FOR FABRICATING SAME

This application is a division of application Ser. No. 09/835,410, filed on Apr. 17, 2001, now U.S. Pat. No. 6,627,332, the entire contents of which are hereby incorporated by reference.

BACKGROUND OF THE INVENTION (a) Field of the Invention

The present invention relates to an organic electroluminescent (EL) device having a plurality of light emitting pixels arranged in a matrix and a method for fabricating the same, especially to the method of fabricating the organic EL device having a plurality of minute electrode lines formed by a vacuum evaporation process using a patterning mask.

(b) Description of the Related Art

An organic EL device utilizes a phenomenon in which a hole injected into an anode and an electron injected into a cathode are recombined in a light emitting layer to emit light through an excited state. Various device configurations of the organic EL devices have been investigated based on the properties of the light emitting materials of the light emitting layer. The device is basically obtained by sandwiching the organic light emitting layer emitting strong fluorescence by the anode and the cathode.

For attaining the higher light emitting efficiency and the stable operation, a charge injecting and transporting layer such as a hole injecting and transporting layer and an electron injecting and transporting layer or an interface layer is mounted or a guest molecule is doped into the organic light emitting layer. For the purpose of improving the light emitting efficiency and the lifetime, the material for the electrode, especially the cathode is investigated. The improvements of the structure and the material of the device provide the performance for the practical use though not completely satisfactorily.

Prototype full-color organic EL display units are reported as application of the organic EL device. Examples of the schemes for generating three colors in an EL display unit includes a separate-three-color emitting system in which the light emitting devices for the respective colors are mounted parallel on a substrate, a CCM system in which a color conversion layer is mounted on a light emitting surface and a blue light emitting device is used as an EL light emitting source, and a color filter system in which full-color display unit is attained by using a color filter. Each prototype color display unit is fabricated by using one of the systems, and among the three systems, the separate-three-color emitting system is most efficient because the structure is simple and the light emitting is effectively utilized.

A color organic EL display unit using a 320×240 pixel array and having a diagonal size of 5.7 inch is described in the NEC Technical Journal Vol.51, No.10, pp28–32 (1998) as the display unit using the separate-three-color emitting system. During the fabrication of the display unit, the electrode (cathode) lines are deposited through a metal mask pattern having 240 slits (lines). The pixel size of the display unit is 0.36 mm×0.36 mm, and the sub-pixel size is 0.12 mm (120 $\mu$m). A full-color organic EL display unit having a diagonal size of 5.2 inch and a 320×240 pixel is described (Extended Abstracts of $9^{th}$ International Workshop on Inorganic and Organic Electroluminescence, September 14–17, pp137–140 (1998)). The cathode lines of the display unit are deposited by vacuum evaporation by utilizing the blocking of a partition wall having a reversed taper and made of resist. The pixel size of the display unit is 0.33 mm (330 $\mu$m), and the sub-pixel size is 0.12 mm (120 $\mu$m).

As described above, the organic EL device of the separate-three-color emitting system possibly provides the simple structure with the higher light emitting efficiency. However, in the formation of the conventional prototype electrode (cathode) lines by using a metal mask having apertures on the lines, the minute cathode lines can be hardly formed because the warp of the mask is generated due to the radiation heat during the formation of the cathode, and the shape of the aperture cannot be maintained due to the stress made by the mask holder.

Further in the organic EL display unit having the cathode lines formed by the blocking of the partition wall having the reversed taper, the dark spots of the pixels are generated and grown due to moisture in the resist, thereby producing defective display units.

In order to fabricate the full-color organic EL display unit having less defection and a higher definition in the order of hundred micrometers by using the vacuum evaporation, the cathode lines are efficiently deposited through the apertures of the metal mask having the higher minuteness. For realizing the fabrication of the above full-color organic EL display unit, the metal mask should be used having the aperture an accuracy of which is not affected by the tension or the radiation heat.

SUMMARY OF THE INVENTION

In view of the foregoing, an object of the present invention is to provide an organic EL device having pixels of higher minuteness and a higher ratio of apertures and a method for fabricating the same. The higher minuteness and the higher ratio of apertures can be achieved by formation of the minute cathode lines having a pixel pitch of about one-hundred $\mu$m by using a metal mask (patterning mask).

The present invention provides, in a first aspect thereof, an organic electroluminescent (EL) device including: a substrate; a pair of electrodes each including a plurality of having electrode lines and overlying the substrate; and an organic film including at least one light emitting layer disposed between the electrodes; each of the electrode lines being formed by a plurality of electrode units each overlapped with adjacent electrode units.

The present invention provides, in a second aspect thereof, a method for fabricating an organic EL device including the steps of: forming an organic film sandwiched by a pair of electrodes overlying a substrate; patterning the electrodes to form a plurality of electrode lines, at least one of the electrodes being patterned by moving a patterning mask parallel to the substrate to form a plurality of electrodes units which are overlapped among one another overlying the organic film.

In accordance with the present invention, the minute electrode lines in the order of a hundred micrometer pitch can be formed by, for example, vacuum evaporation by use of the patterning mask (metal mask). When the method for fabrication is applied to an organic EL display unit, the full-color organic EL display unit can be realized with the minuteness of about 254 ppi (pixel per inch).

The above and other objects, features and advantages of the present invention will be more apparent from the following description.

PREFERRED EMBODIMENTS OF THE INVENTION

At first, principles of the present invention will be described for a purpose of clear understanding referring to FIGS. 1A, 1B, 2 to 6.

Figure 1A:
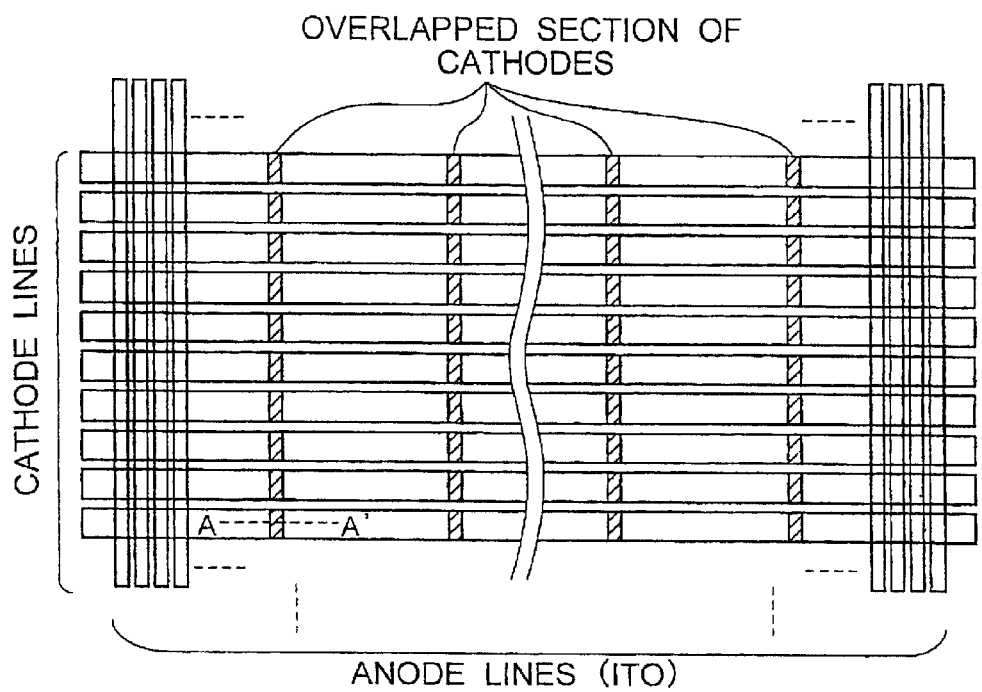
FIG. 1A is a schematic view showing the cathode lines of the organic EL device in accordance with an example of the present invention.
Figure 1B:
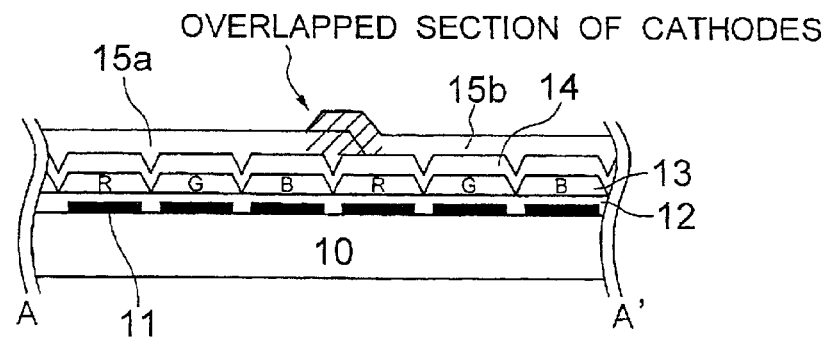
FIG. 1B is a sectional view of the organic EL device of FIG. 1A taken along the line A–A' of FIG. 1A.

An organic EL device shown in FIGS. 1A and 1B includes an anode 11—a hole injecting and transporting layer 12—a light emitting layer 13—an electron injecting and transporting layer 14—a cathode 15 overlying a substrate 10 wherein a pair of the cathodes are partially overlapped and extending in a horizontal direction (X-direction).

An example of the structure of the organic EL device other than that shown in FIG. 1B includes and is not restricted to the anode—the light emitting layer—the cathode; the anode—the light emitting layer—the electron injecting and transporting layer—the cathode; the anode—the hole injecting and transporting layer—the light emitting layer—the cathode; the anode—the interface layer—the hole injecting and transporting layer—the light emitting layer—the electron injecting and transporting layer—the cathode; the anode—the hole injecting and transporting layer—the light emitting layer—the electron injecting and transporting layer—the interface layer—the cathode; the anode—the interface layer—the light emitting layer—the electron injecting and transporting layer—the cathode; the anode—the hole injecting and transporting layer—the light emitting layer—the interface layer—the cathode; and the anode—the interface layer—the light emitting layer—the interface layer—the cathode.

The light emitting layer is basically made of an organic compound and may be a single layer or a multi layer. If required, guest molecules may be doped into the light emitting layer. The interface layer, the hole injecting and transporting layer and the electron injecting and transporting layer may be made of the organic compound, an inorganic compound or a mixture thereof, and any known material may be applied. These layers may be a single layer or a multi layer.

The pair of the cathodes are partially overlapped to form the linear cathode in FIGS. 1A and 1B. However, for example, the cathode—the electron injecting and transporting layer—the light emitting layer—the hole injecting and transporting layer—the anode are mounted in this order on the substrate, thereby forming the linear anode by the partial overlapping between a pair of the anodes.

The anode has a role of injecting a hole into the hole injecting and transporting layer, the interface layer and the light emitting layer, and has a work function of 4.5 eV or more. A concrete example of the anode material includes indium-tin oxide (ITO) alloy, tin oxide (NESA), zinc-indium oxide, gold, silver platinum and copper.

The cathode has a role of injecting an electron into the electron injecting and transporting layer, the interface layer and the light emitting layer, and preferably has a smaller work function. A concrete example of the cathode material includes indium, aluminum, magnesium, magnesium-indium alloy, magnesium-silver alloy, magnesium-aluminum alloy, aluminum-lithium alloy and aluminum-scandium-lithium alloy. A sealing layer made of a metal oxide, a metal sulfide, a metal fluoride or a polymer may be mounted for protecting the device from oxygen and moisture.

Figure 2:
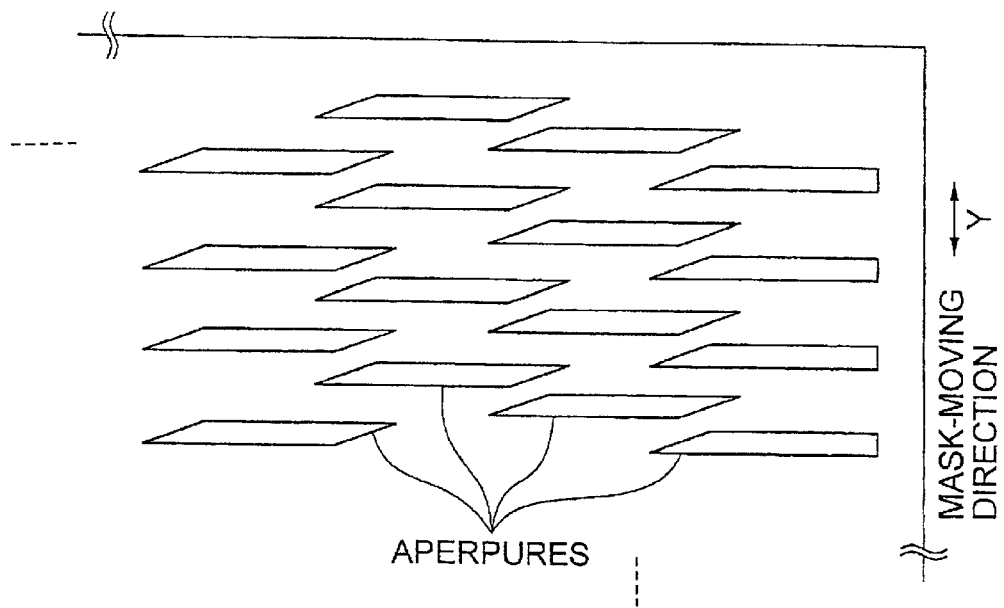
FIG. 2 is a top plan view showing a first example of a patterning mask.
Figure 3:
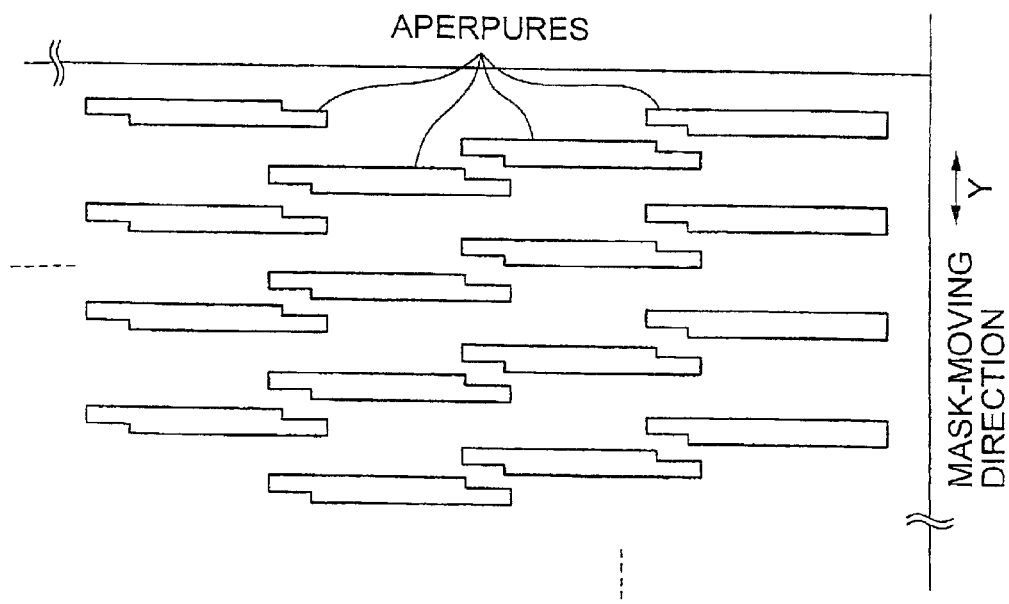
FIG. 3 is a top plan view showing a second example of a patterning mask.
Figure 4:
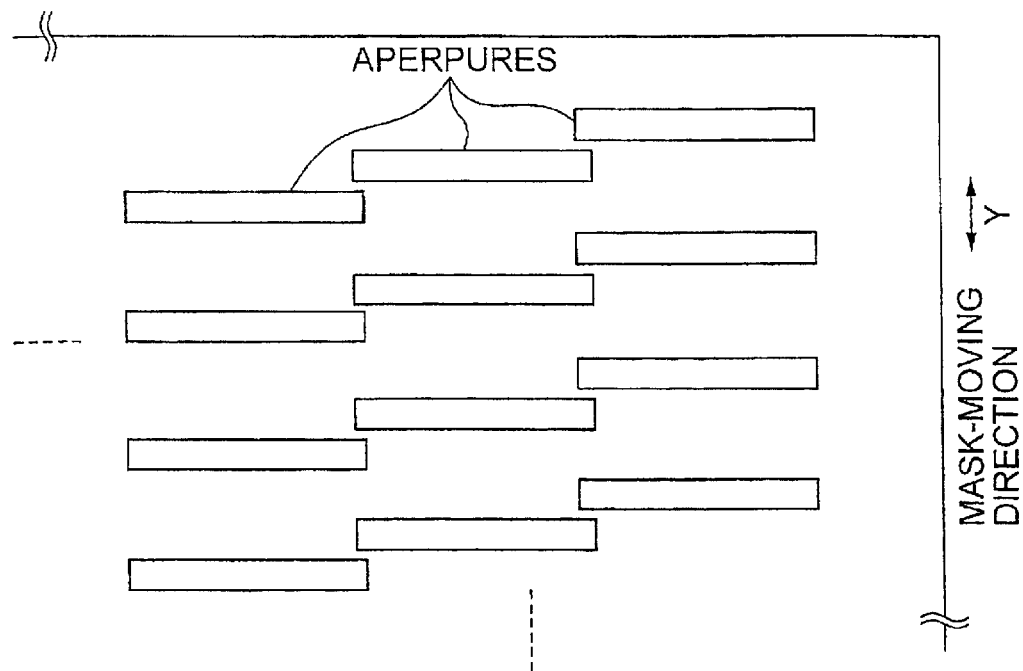
FIG. 4 is a top plan view showing a third example of a patterning mask.
Figure 5:
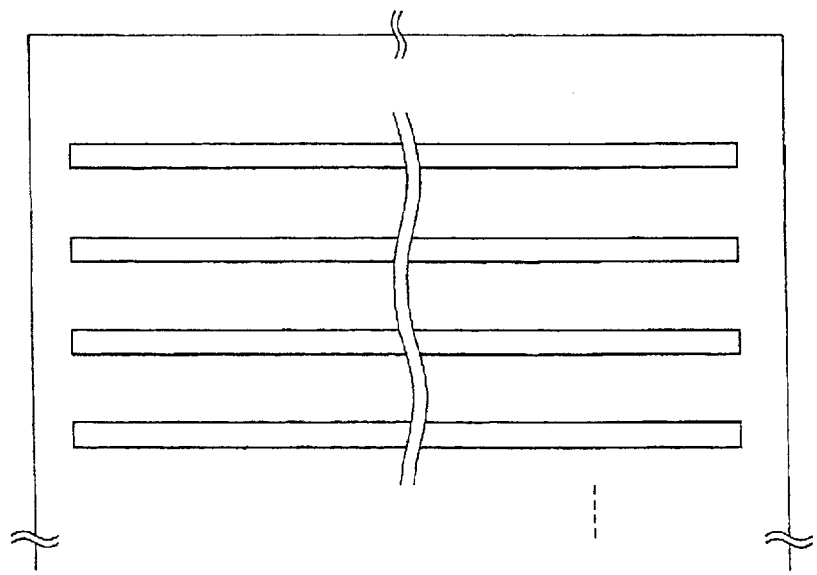
FIG. 5 is a top plan view showing a conventional example of a patterning mask.
Figure 6:
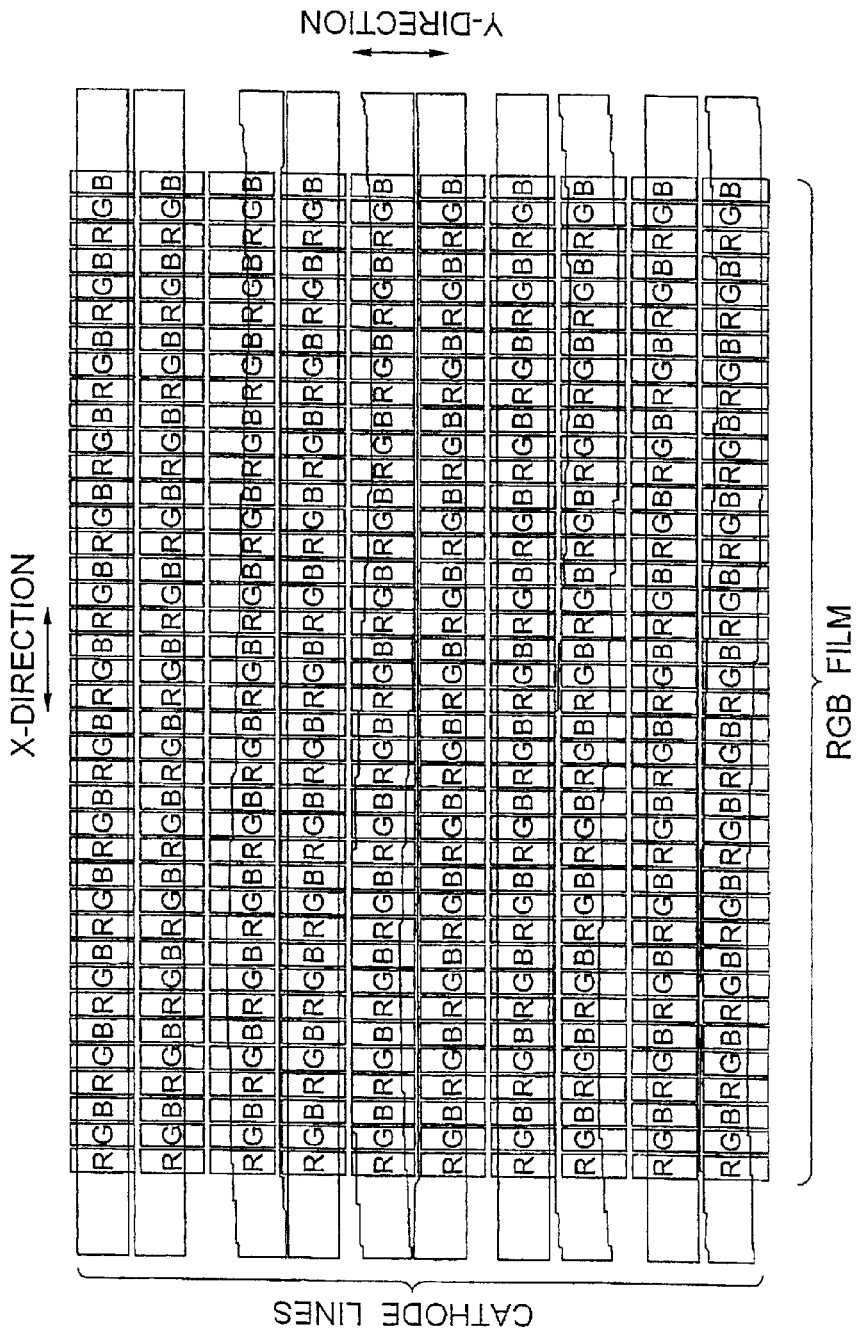
FIG. 6 is a top plan view showing cathode lines formed by moving the patterning mask of FIG. 5.

An example of the patterning mask for forming the electrode line of the organic EL device by partially overlapping the plurality of the electrodes is shown in the schematic views of FIGS. 2 to 4. Among them, the patterning masks shown in FIGS. 2 and 3 having a larger space between the adjacent apertures can prevent the distortion of the mask aperture by the stress due to the pulling from the mask holder, a magnetic field and radiation heat. By applying the aperture structure shown in FIGS. 2 to 4 to a patterning mask for forming a conventional electrode line as shown in FIGS. 5 and 6, the distortion of the mask can be removed.

In the present invention, the plurality of the electrode lines can be fabricated with the higher minuteness when the organic EL device having the electrode lines is formed by partly overlapping the plurality of the electrodes. The procedures for forming the electrode lines include, as described in JP Patent Application No. 10-365552, mounting the patterning mask to a stage for moving the patterning mask movable independently in the X and Y-directions perpendicular to each other controlled by a pulse controlling motor; mounting the substrate to a stage for moving the substrate which includes a Z-axis swing means for adjusting a distance between the substrate and the patterning mask, and a swing angle, a rotating means for adjusting a rotation angle between the substrate and the mask pattern; and an X-axis and/or Y-axis moving means for moving and minutely adjusting the substrate in the X-direction and/or the Y-direction; overlapping the substrate and the patterning mask keeping a distance therebetween; adjusting a positional relation between substrate and the patterning mask by adjusting the stage for moving the substrate; vapor-depositing an electrode material on the surface of the substrate through the pattern; minutely moving the stage for moving the patterning mask parallel to the substrate such that part of the pattern of the patterning mask is overlapped with the deposited section on the substrate; and vapor-depositing the electrode material to the substrate.

In the control of the position and the speed of the patterning mask conducted by the pulse control motor, the position control and the minute moving of the patterning mask with the higher accuracy can be performed by controlling the pulse control motor in accordance with a digital input instruction system having a built-in feedback system (incremental instruction). The movement of the patterning mask with the higher accuracy can be guaranteed by using a system having a rotation angle sensor including a pulse encoder in accordance with the incremental instruction when the pulse control motor is driven.

The pulse control motor employable in the present invention determines an amount of the movement of a motor shaft depending ion the number of pulses and includes a direct current servomotor (DC servomotor), a stepping motor, print motors, a DC micro-motor and AC servomotors.

The gap between the substrate and the patterning mask can be adjusted by disposing a magnet such as a permanent magnet and an electromagnet on the bottom surface of the substrate for attracting the patterning mask by a magnetic field. The patterning accuracy decreases with the increase of the gap. Since the influence of the gap increases with the minuteness of the pattern pitch, the patterning mask is preferably attracted by using the magnetic field. The shape and the size of the magnet are not restricted, and should be designed such that the attracting force perpendicular to the substrate surface is uniformly applied to the entire apertures of the mask. The patterning mask may contain a magnetic element such as nickel, cobalt and iron when the patterning mask is attracted by the magnet, and the nickel-plated patterning mask may be effectively used.

The substrate having an insulating spacer of a thickness larger than that of the organic EL device erected on the top surface of the substrate can be effectively used. The magnetic field significantly reduces the gap between the patterning mask and the substrate, and the patterning can be performed without injury of the organic thin film and the electrode lines by means of the spacer. A black matrix may be formed on all or part of the spacer. The spacer may be fabricated by means of any method and by using any material. However, the spacer can be simply fabricated by using photolithography. The height of the spacer should be high enough not to worsen the patterning accuracy by the movement of the deposited material so far as it is larger than the thickness of the organic EL device, and preferably between 0.2 and 200 $\mu$m. The striped spacers perpendicular to either of the electrode lines easily forms light emitting picture elements. The spacer may be formed any position except for a position for forming the picture elements. The spacers are not required to be striped or linear.

The position adjustment and accurate movement mechanism for the patterning mask and the glass substrate preferably includes a substrate moving stage having a Z-swing stage having a support of the substrate and capable of changing the distance and the swing between the substrate and the patterning mask, a rotation stage for adjusting a rotation angle between the substrate and the patterning mask, and a Y-stage for performing the adjustment of the rough movement and the minute movement in X and Y-directions; and a patterning mask moving stage having a support for the patterning mask and adjusting the positional relation by the control and the driving of an XY stage having a lattice leaf spring by using the pulse control motor. Such a configuration enables the minute adjustment of the gap between the substrate and the patterning mask, and easily suppresses the deviation of the pattern due to the angle between the deposition source and substrate. Since the amount of the movements in each of the stages can be accurately controlled if the substrate size, the size and the shape of the pattern are different, the higher minuteness of the pitches in the order of $\mu$m can be obtained as well as the organic EL device can be fabricated with higher yield.

In the control and the driving by the pulse control motor, the substrate moving stage further includes, in addition to the XY stage for minutely moving the patterning mask, the substrate moving stage having the Z-swing stage capable of changing the distance and the swing between the substrate and the patterning mask, the rotation stage for adjusting the rotation angle between the substrate and the patterning mask, and the XY-stage for performing the adjustment of the rough movement and the minute movement in the XY-directions. If required, the substrate is parallel and minutely moved to form the electrode lines.

Now, the present invention is more specifically described with reference to accompanying drawings.

EXAMPLE 1

Patterning Mask for Forming Substrate and RGB Light Emitting Layer

A glass plate of 120 mm×100 mm×1.1 mm was used as a substrate on which 3072 ITO stripes were formed at a space of 7 $\mu$m. On the four corners of the substrate, the respective four marks made of the ITO were formed for adjusting the position.

Figure 7:
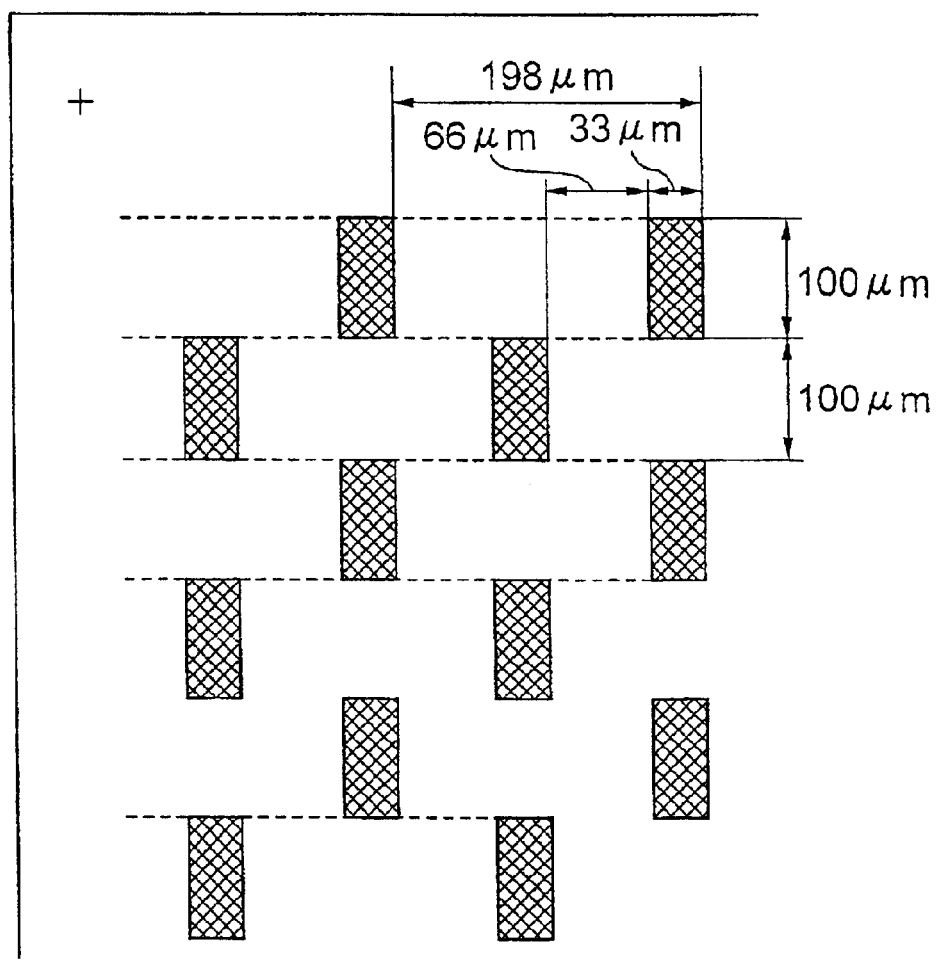
FIG. 7 is a schematic view showing a metal mask (patterning mask) used for patterning an RGB film employed in Example 1 and 2 and Comparative Example.

A patterning mask for isolating the light emitting (RGB) film was made of copper having a nickel-plated surface and had a thickness of about 35 $\mu$m including the plated portion. The thickness in the vicinity of the aperture was thinner and about 5 $\mu$m. As shown in FIG. 7, the apertures were regularly formed at an X-direction width of 33 $\mu$m width and a Y-direction width of 10 $\mu$m width. The respective four markers (apertures) for adjusting the position were perforated through the mask the positions of which corresponded to the marks of the glass substrate.

Figure 8:
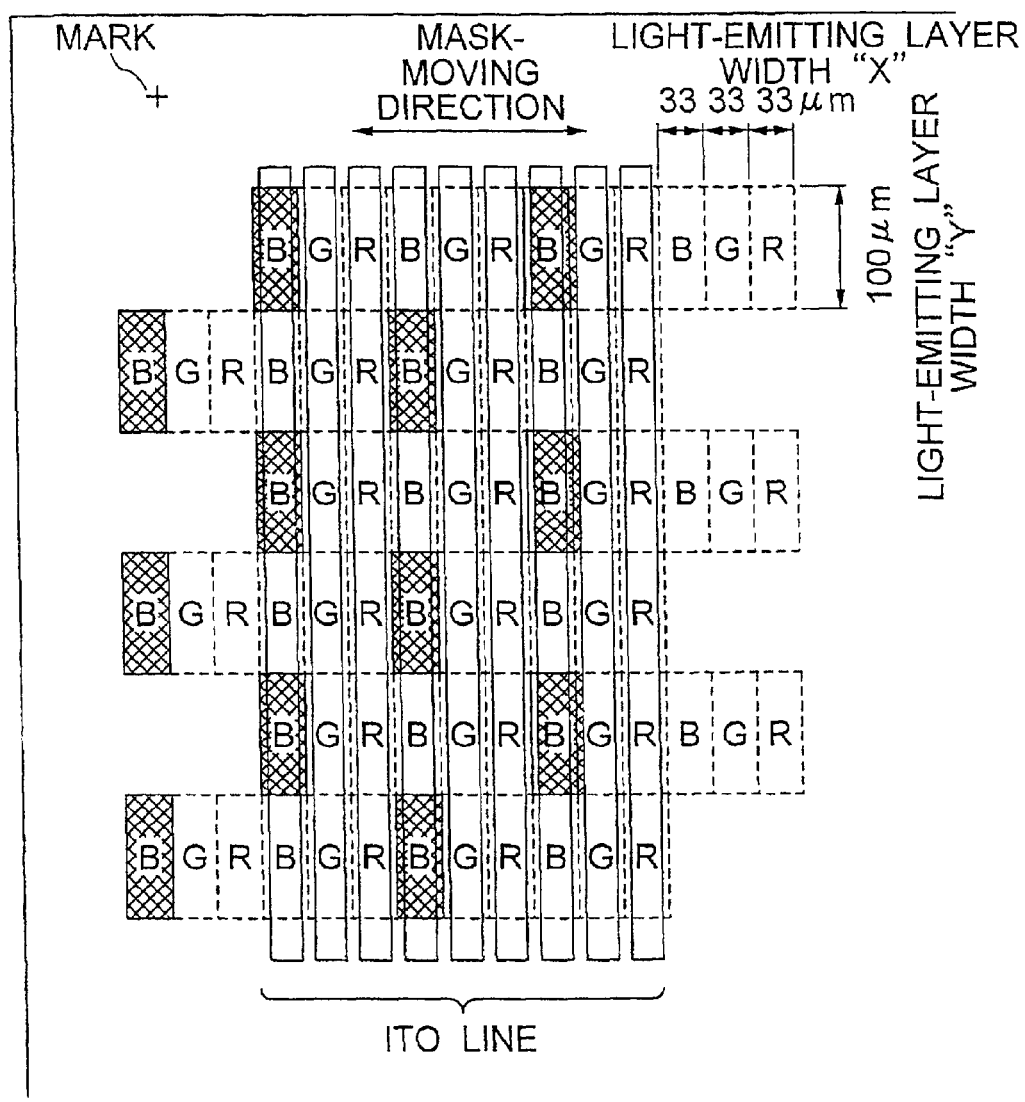
FIG. 8 is an image drawing for conducting the patterning of the RGB film by minutely moving the mask pattern in the X-direction after the patterning mask of FIG. 7 and the ITO line used in Example 1 and 2 and Comparative Example are overlapped.

As shown in FIG. 8, the patterning mask was moved parallel with respect to the substrate in the X-direction stepwise by 32 $\mu$m, and red light emitting layers (R) were formed at first and fourth depositions, green light emitting layers (G) were formed at second and fifth depositions, and blue light emitting layers (B) were formed at third and sixth depositions. In this manner, the light emitting film having the same color could be formed on the single ITO line, and the B, G and R light emitting films having the X-direction width of 33 $\mu$m and the Y-direction width of 100 $\mu$m could be patterned at the X-direction pitch of 33 $\mu$m and the Y-direction pitch of 100 $\mu$m.

Pattern Formation of RGB Light Emitting Layer

A hole injecting and transporting layer having a thickness of 50 nm was formed on the entire portion of the substrate having the ITO where the light emitting devices were formed. An RGB light emitting layer was patterned on the hole injecting and transporting layer.

The position adjustment between the pattern (metal) mask and the substrate was conducted by means of monitoring by using a microscope equipped with a CCD camera mounted over the substrate. The position adjustment was conducted by using an X and Y direction roughly moving mechanism at the substrate moving stage, an X and Y direction minutely moving mechanism at the metal mask moving stage and a rotation mechanism of the substrate holder. At this stage, a gap between the substrate and the patterning mask stage was maintained at 100 μm by using a Z-direction moving mechanism. During the patterning, a moving sequence which was not affected by backlash of a motor was used as the metal mask.

The light emitting films (R, G, B) were formed by a vacuum evaporation method using resistance heating. A deposition source of a source load locking system was moved immediately below the substrate center during the formation of the light emitting layer to minimize the influence of the angle between the deposition source and the substrate. Three molybdenum boats were filled with the respective R, G, B light emitting materials, that were mounted on the deposition source.

At first, the position adjustment between the glass substrate and the patterning mask was conducted by using the rotation mechanism of a table for holding the substrate and the X and Y-directions roughly moving mechanism. Then, the metal mask was moved to the place where the R light emitting layer was formed by moving the stage for the patterning mask movement in the X-direction by using a DC servomotor. By applying a magnetic field by using an electromagnet placed on the substrate, the R light emitting material was deposited at a film-forming speed of 0.2 nm/s under a vacuum of $1.0 \times 10^{-5}$ Pa to form the R light emitting layer having a thickness of 50 nm. After the electromagnet was turned off and the patterning mask was moved in the X-direction by 33 μm, the electromagnet was turned on and the G light emitting material was deposited at a film-forming speed of 0.2 nm/s to form the G light emitting layer having a thickness of 50 nm. After the electromagnet was turned off again and the patterning mask was moved in the X-direction by 33 μm (FIG. 8), the electromagnet was turned on and the B light emitting material was deposited at a film-forming speed of 0.2 nm/s to form the B light emitting layer having a thickness of 50 nm. Then, the further three patterning mask movements by 33 μm sequentially formed the R, G, B light emitting layers. The six depositions formed the patterns of all the B, G, R light emitting layers having the X-direction width of 33 μm, the Y-direction width of 100 μm, the X-direction pitch of 33 μm and the Y-direction pitch of 100 μm at the specified positions.

Finally, the electron injecting and transporting layer having a thickness of 40 nm was formed on the patterned RGB light emitting layer to provide the organic film layer in accordance with Example 1 of the present invention.

Patterning of Cathode Lines

Figure 9:
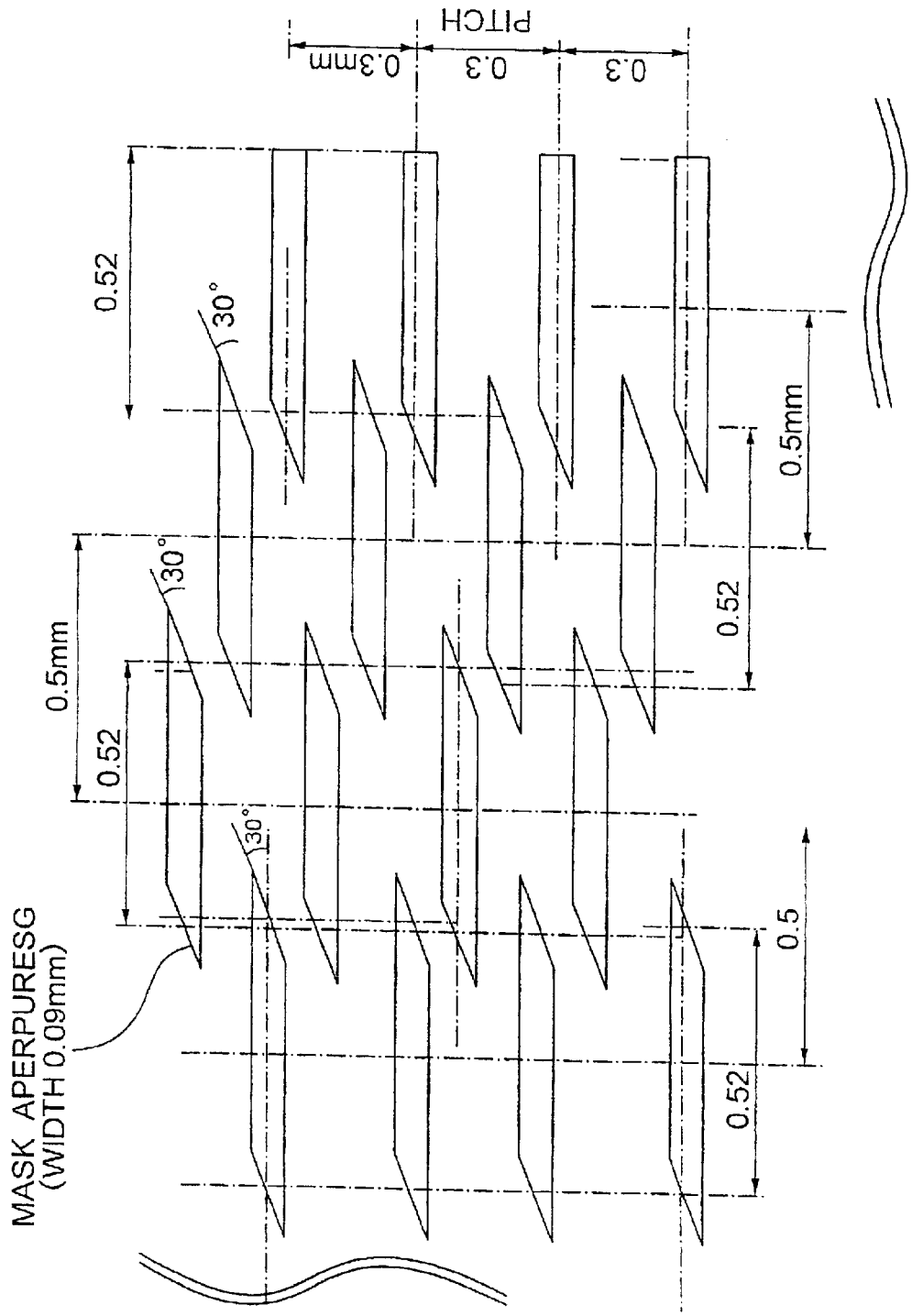
FIG. 9 is a schematic view showing part of the patterning mask for forming the cathode lines used in Example 1.

The patterning mask for forming the cathode lines of Example 1 is shown in FIG. 9 and was also prepared by etching a copper plate the surface of which was nickel-plated. A thickness was generally about 35 μm and that in the vicinity of the aperture was about 5 μm.

The Y-direction (vertical direction) width of the aperture was 90 μm, and one side of the X-direction width was 0.52 mm. The apertures were parallelograms except for those forming the edge. When the cathode was formed by the three depositions in total by moving the patterning mask by 100 μm in the Y-direction, all the cathode lines having a Y-direction width of 90 μm, a space of 10 μm and a pitch of 100 μm could be formed in stripes by the partial overlapping between the cathode lines of the plurality of the parallelograms.

The glass substrate having the organic film layer was conveyed from the apparatus keeping the vacuum to a metal mask moving stage mounting a patterning mask for forming the cathode in another vacuum chamber. The gap between the substrate and the mask moving stage was kept to be 100 μm. The position adjustment between the patterning mask and the substrate was conducted by means of monitoring by using a microscope equipped with a CCD camera mounted over the substrate.

The cathode lines were formed such that the lines extended perpendicular to the ITO lines and did not exist outside the region including the organic film+100 μm width in the Y-direction.

The cathode of Example 1 was made of aluminum-lithium alloy. A basket having aluminum therein was placed 5 cm from the position immediately below the center of the substrate by 75 cm, and a getter having lithium was placed 5 cm from the position (10 cm from the aluminum basket). The deposition source included the aluminum basket and the lithium getter.

The patterning mask for forming the cathode was fixed to a place where the first cathode was formed below the substrate, and an electromagnet disposed on the bottom surface of the substrate was turned on. Under the circumstance at a vacuum upto $1 \times 10^{-4}$ Pa, the aluminum and the lithium were simultaneously blown on the substrate to form the cathode made of Al—Li alloy having the thickness of about 150 nm. After the turn-off of the electromagnet, the patterning mask was moved in the Y-direction by about 100 nm to a place where the second cathode was formed, and the electromagnet was turned on again. Under the circumstance at a vacuum up to $1 \times 10^{-4}$ Pa, the aluminum and the lithium were simultaneously blown on the substrate to form the cathode made of Al—Li alloy having the thickness of about 150 nm. After the turn-off of the electromagnet, the patterning mask was further moved in the Y-direction by about 100 nm to a place where the third cathode was formed, and the electromagnet was turned on again. Under the circumstance at a vacuum upto $1 \times 10^{-4}$ Pa, the aluminum and the lithium were simultaneously blown on the substrate to form the cathode made of Al—Li alloy having the thickness of about 150 nm.

Figure 10:
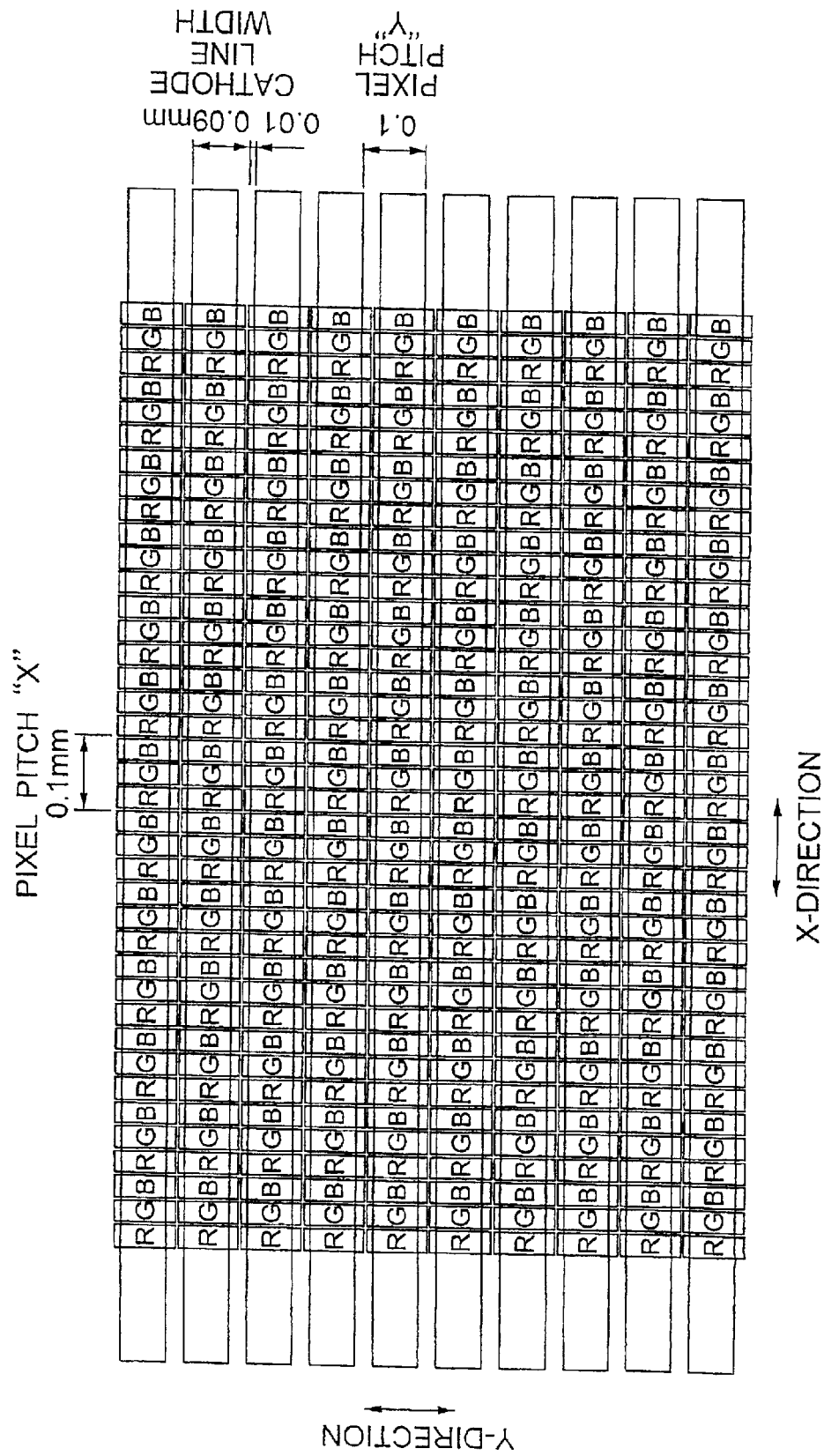
FIG. 10 is a schematic view showing formation of the cathode lines of Example 1 obtained by minutely moving the patterning mask of FIG. 9.

As shown in FIG. 10, the organic EL device having the cathode lines formed by using the patterning mask of FIG. 9 was formed on the substrate. In FIG. 10, the ITO lines, the hole injecting and transporting layer and the electron injecting and transporting layer are omitted. As shown therein, the formation of the parallel cathode lines having the Y-direction width up to 90 μm and the space up to 10 μm was confirmed. The cathode lines of L/S=90/10 μm could be formed on the four corners of the light emitting section and the central section. The fluctuation of the "cathode lines/spaces" was ±1 μm at maximum. The cathode did not exist outside the region including the organic film+100 μm width in the Y-direction and was confirmed in the permitted region.

A conduction test for both ends of the single cathode line was conducted to detect no insulation. The cathodes extending in the X-direction were partially overlapped to form the cathode line stripe having a specified length.

A conduction test for the adjacent cathode lines regularly arranged in the Y-direction was conducted to detect no conduction. The minute isolation of the cathode lines of the 100 μm pitch (space: 10 μm) could be achieved. The organic EL device thus fabricated was subject to the light emission, and the light emission from all pixels could be observed. The pixel pitches of the X-direction and the Y-direction were 99 μm and 100 μm, respectively. The aperture ratio of was about 70% according to the design value. The full-color light emitting device was fabricated having the higher minuteness and the higher aperture ratio than those of the conventional device in which the cathode lines were formed by using the patterning mask having striped apertures.

In accordance with Example 1, the formation of the cathode lines having the higher minuteness, for example, the line width of 90 μm and the space of 10 μm in the organic EL device could be realized by moving the patterning mask (metal mask) having the specified shape.

EXAMPLE 2

Patterning Mask for Forming Substrate and RGB Light Emitting Layer

The mask for forming the substrate and the RGB light emitting layer was substantially same as that used in Example 1.

Pattern Formation of RGB Light Emitting Layer

The pattern formation of the RGB light emitting layer was substantially same as that in Example 1.

Patterning of Cathode Lines

Figure 11:
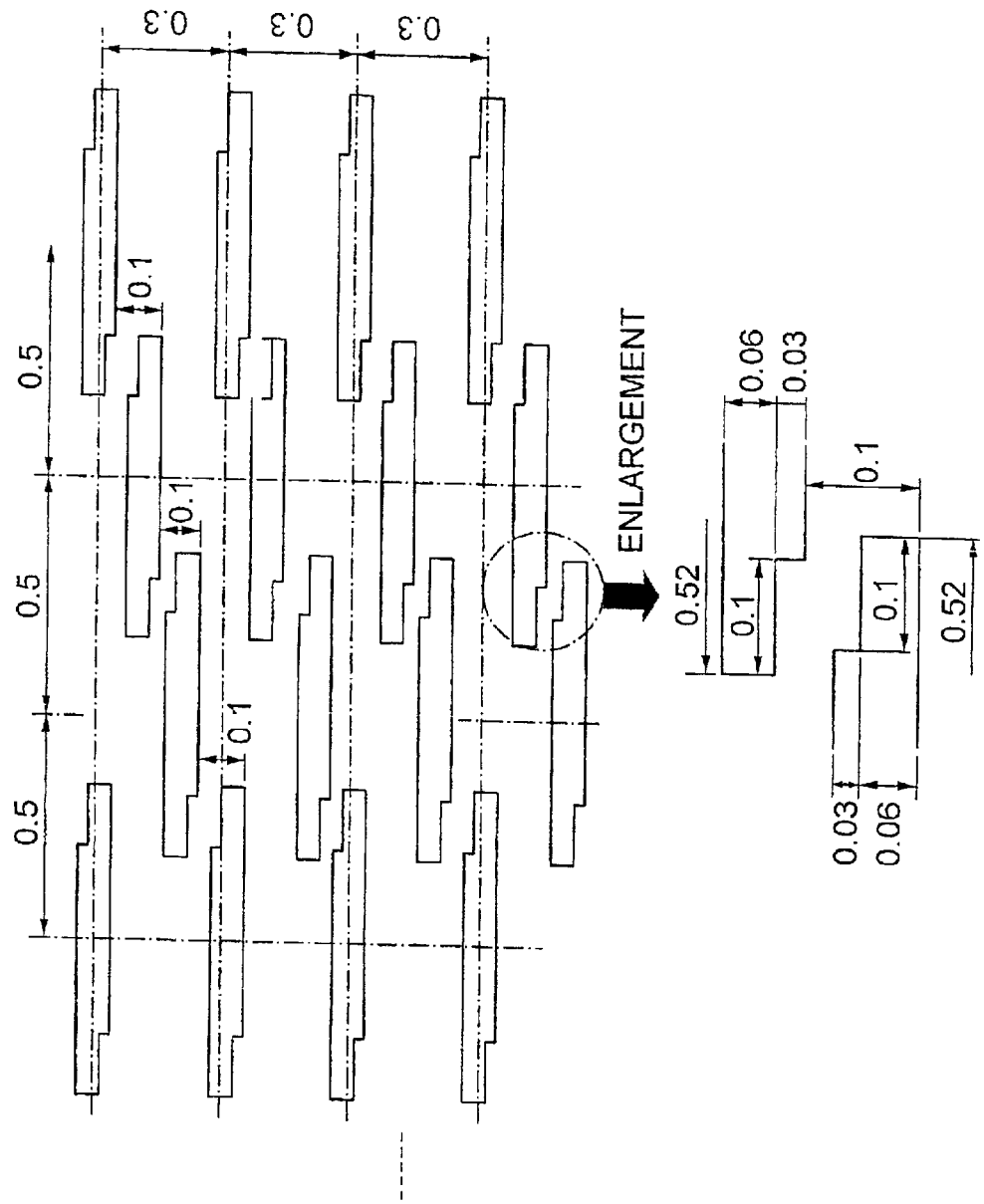
FIG. 11 is a schematic view showing part of the patterning mask for forming the cathode lines used in Example 2.

The patterning mask for forming the cathode lines of Example 2 is shown in FIG. 11 and was also prepared by etching a copper plate the surface of which was nickel-plated. A thickness was generally about 35 μm and that in the vicinity of the aperture was about 5 μm.

The Y-direction (vertical direction) width of the aperture was 90 μm at maximum, and the X-direction width was 0.52 mm. As shown in the enlarged portions of FIG. 1, both ends of the apertures were narrowed to increase the space between itself and the adjacent aperture, thereby increasing the mask strength. When the cathode was formed by the three depositions in total by moving the patterning mask by 100 μm in the Y-direction, all the cathode lines having a Y-direction width of 90 μm, a space of 10 μm and a pitch of 100 μm could be formed in stripes by the partial overlapping between the cathodes.

Figure 12:
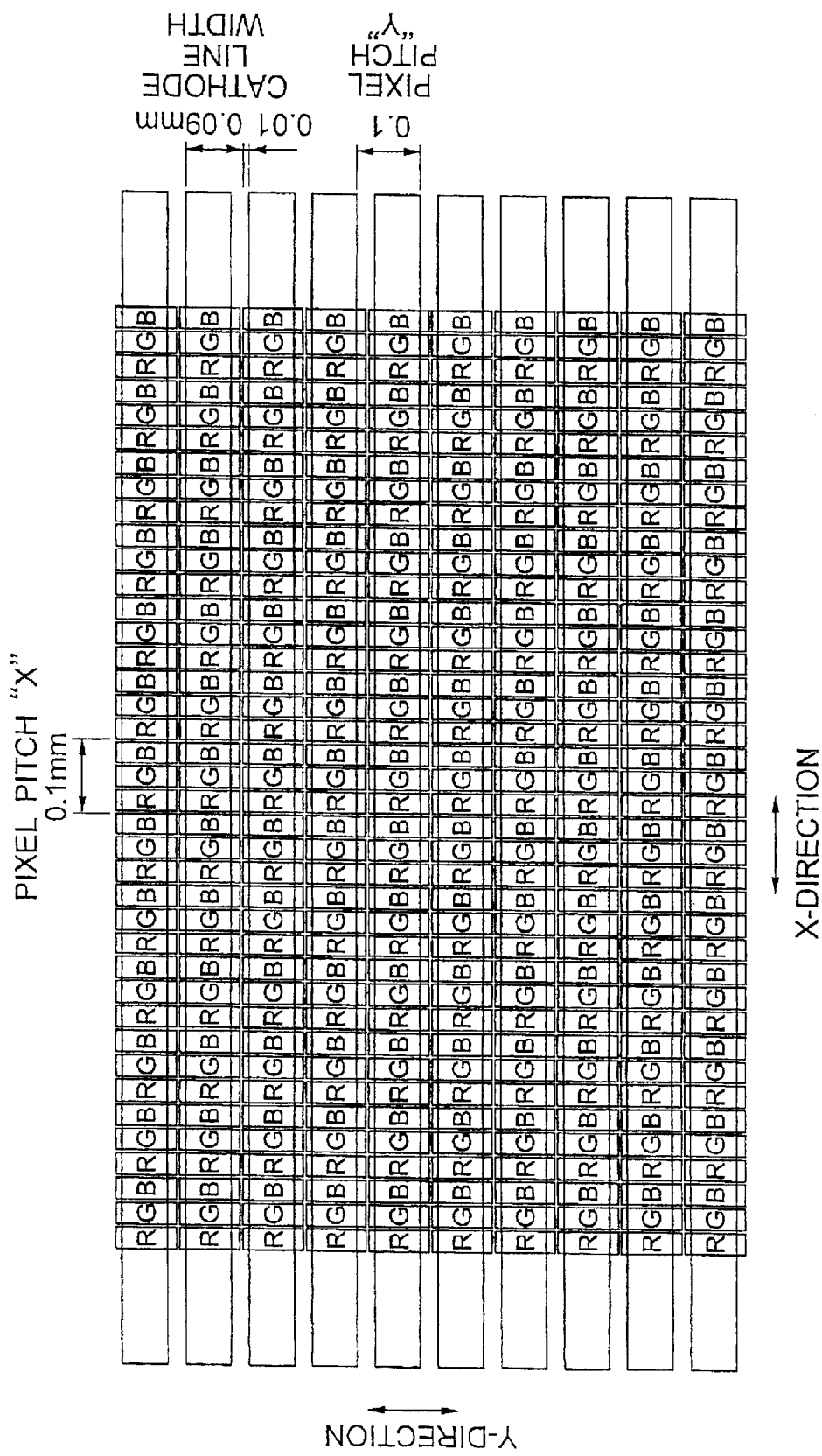
FIG. 12 is a schematic view showing formation of the cathode lines of Example 2 obtained by minutely moving the patterning mask of FIG. 11.

The formation of the cathode was similarly conducted to Example 1. As shown in FIG. 12 exemplifying the organic EL device fabricated by the patterning mask of FIG. 11 and omitting the ITO lines, the hole injecting and transporting layer and the electron injecting and transporting layer for simplicity, the parallel cathode lines formation was confirmed having a Y-direction width up to 90 μm and a space up to 10 μm. The fluctuation of the "cathode lines/spaces" was ±1 μm at maximum. The cathode did not exist outside the region including the organic film+100 μm width in the Y-direction and was confirmed in the permitted region.

In accordance with Example 1, the formation of the cathode lines having the higher minuteness, for example, the line width of 90 μm and the space of 10 μm in the organic EL device could be realized by moving the patterning mask (metal mask) having the specified shape.

A conduction test for both ends of the single cathode line was conducted to detect no insulation. The cathodes extending in the X-direction were partially overlapped to form the cathode line stripe having a specified length.

A conduction test for the adjacent cathode lines regularly arranged in the Y-direction was conducted to detect no conduction. The minute isolation of the cathode lines of the 100 μm pitch (space: 10 μm) could be achieved. The organic EL device thus fabricated was subject to the light emission, and the light emission from all pixels could be observed. The pixel pitches of the X-direction and the Y-direction were 99 μm and 100 μm, respectively. The aperture ratio of was about 70% according to the design value. The full-color light emitting device was fabricated having the higher minuteness and the higher aperture ratio than those of the conventional device in which the cathode lines were formed by using the patterning mask having striped apertures.

COMPARATIVE EXAMPLE

Patterning Mask for Forming Substrate and RGB Light Emitting Layer

The mask for forming the substrate and the RGB light emitting layer was substantially same as that used in Example 1.

Pattern Formation of RGB Light Emitting Layer

The pattern formation of the RGB light emitting layer was substantially same as that in Example 1.

Patterning of Cathode Lines

Figure 13:
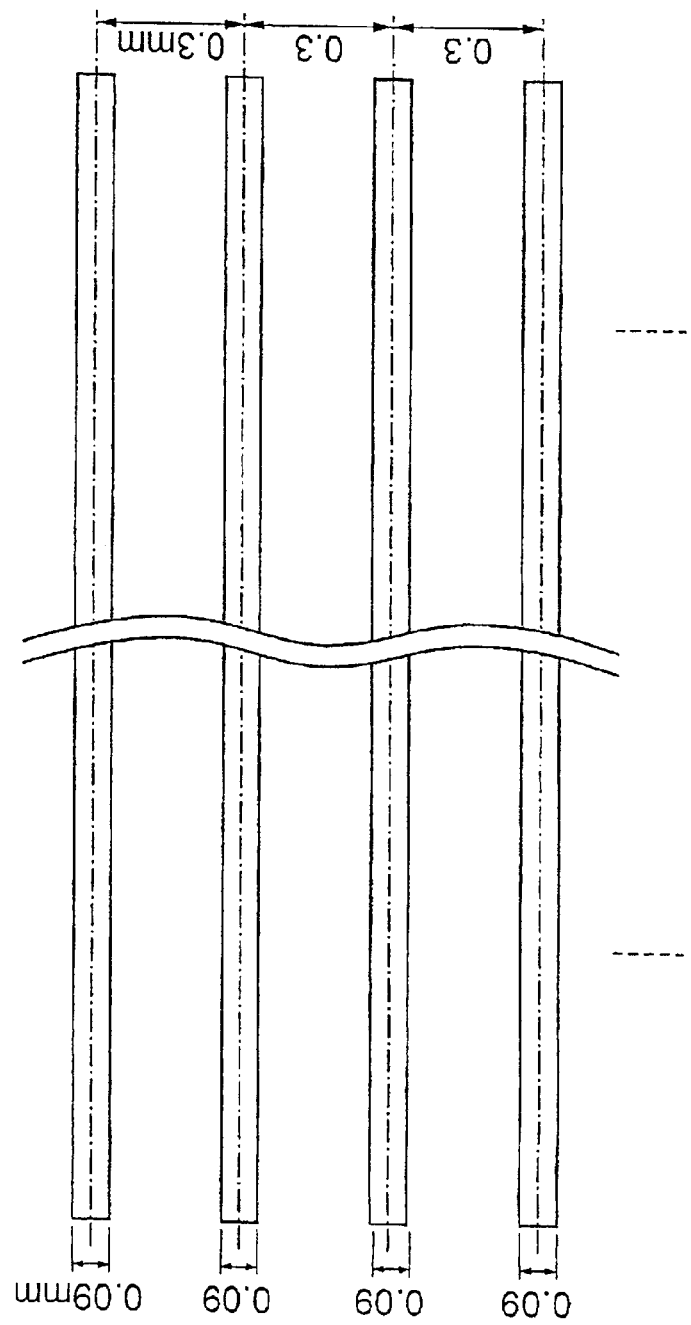
FIG. 13 is a schematic view showing part of the patterning mask for forming the cathode lines used in Comparative Example.

The patterning mask for forming the cathode lines of Comparative Example is shown in FIG. 13 and was also prepared by etching a copper plate the surf ace of which was nickel-plated. A thickness was generally about 35 μm and that in the vicinity of the aperture was about 5 μm.

The Y-direction (vertical direction) width of the aperture was 90 μm, and the lines were formed in stripes at a pitch of 0.3 mm. When the cathode was formed by the three depositions in total by moving the patterning mask in the Y-direction by 100 μm, the lines having the Y-direction width of 90 μm, the space of 10 μm and the pitch of 100 μm formed, without the partial overlapping, all the cathode line stripes.

The glass substrate having the organic film layer was conveyed from the apparatus keeping the vacuum to a metal mask moving stage mounting a patterning mask for forming the cathode in another vacuum chamber. The gap between the substrate and the mask moving stage was kept to be 100 μm. The position adjustment between the patterning mask and the substrate was conducted by means of monitoring by using a microscope equipped with a CCD camera mounted over the substrate.

The apertures of the patterning mask for forming the cathode were observed, and the partial deformation of the linear apertures and the warp of the mask were detected. As a result, the line pitch of the mask (design value: 300 μm) was non-uniform.

Figure 14:
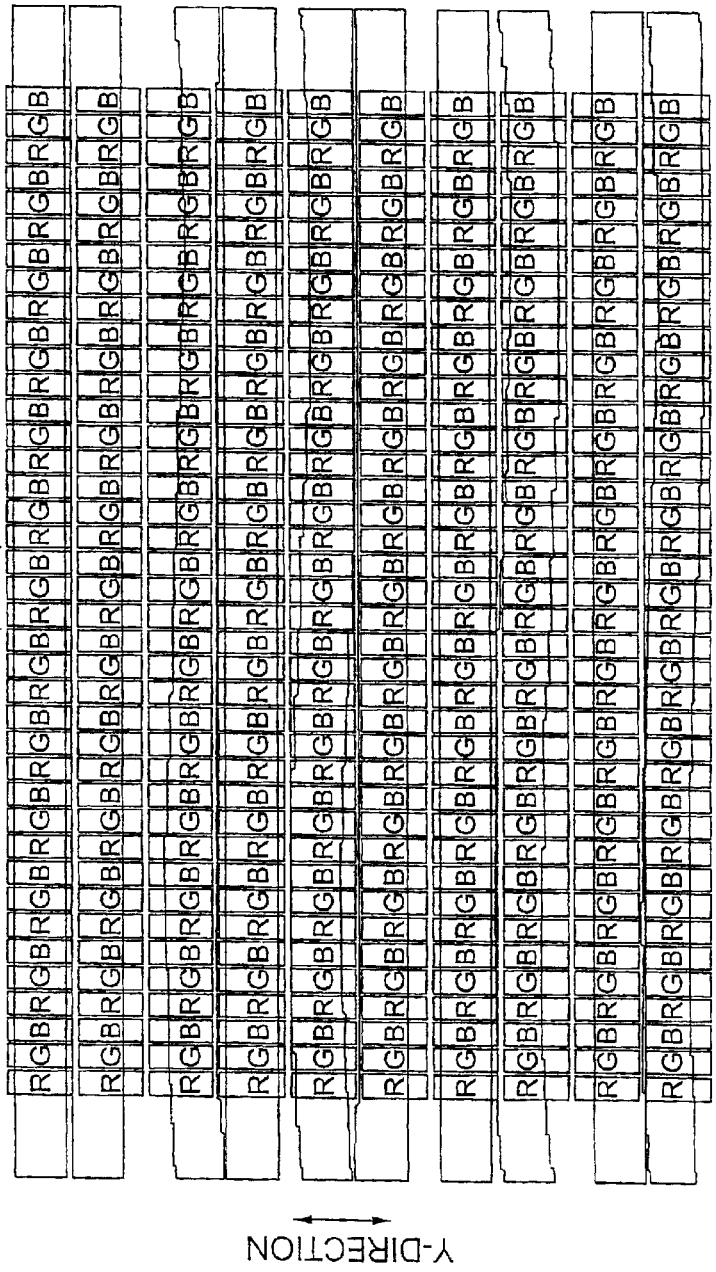
FIG. 14 is a schematic view showing formation of the cathode lines of Comparative Example obtained by minutely moving the patterning mask of FIG. 13.

The formation of the cathode was similarly conducted to Example 1. As shown in FIG. 14 exemplifying the organic EL device fabricated by using the patterning mask of FIG. 13 and omitting the ITO lines, the hole injecting and transporting layer and the electron injecting and transporting layer for simplicity, the cathode lines extending in the X-direction were curved, and the spaces in the Y-direction were partially disappeared. Part of the cathode existed outside the region including the organic film+100 μm width in the Y-direction and the cathode lines could not be formed in the permitted region.

A conduction test for the adjacent cathode lines was conducted, and the detection was observed in 30% of the entire lines. The minute isolation of the cathode lines (space: 10 μm) could be attained. The organic EL device thus fabricated was subject to the light emission, and the light emission from only 50% of the pixels could be observed. Since the cathodes were connected through part of the lines, the light emission from non-selected section in addition to the selected section of the pixel was observed.

When the cathode lines were formed by using the metal mask having the linear striped apertures as shown in FIG. 13, the finer formation of the cathode lines could not be achieved, and the full-color light emitting device could not be fabricated having the higher minuteness and the higher aperture ratio.

Since the above embodiments are described only for examples, the present invention is not limited to the above embodiments and various modifications or alterations can be easily made therefrom by those skilled in the art without departing from the scope of the present invention.

What is claimed is:

1. A method for fabricating an organic EL device comprising the steps of:

forming an organic film sandwiched by a pair of electrodes overlying a substrate;

patterning the electrodes to form a plurality of electrode lines, at least one of the electrodes being patterned by moving a patterning mask parallel to the substrate to form a plurality of electrodes units which are overlapped among one another overlying the organic film, wherein the patterning mask is mounted to a stage for moving the patterning mask movable independently in X and Y-directions perpendicular to each other controlled by a pulse control motor; the substrate is mounted to a stage for moving the substrate which includes a Z-axis swing means for adjusting a distance between the substrate and the patterning mask, and a swing angle, a rotating means for adjusting a rotation angle between the substrate and the mask pattern, and an X-axis and/or Y-axis moving means for moving and minutely adjusting the substrate in the X-direction and/or the Y-direction; the substrate and the patterning mask are overlapped keeping a distance therebetween; a positional relation between substrate and the patterning mask is adjusted by adjusting the stage for moving the substrate; an electrode material is vapor-evaporated on the surface of the substrate through the pattern; the stage for moving the patterning mask is minutely moved parallel to the substrate such that part of the pattern of the patterning mask is overlapped with the deposited section on the substrate; and the electrode material is vapor-evaporated on the substrate.

2. The method as defined in claim 1, wherein a position control and a minute moving of the patterning mask with a higher accuracy is performed by controlling a pulse control motor in accordance with a digital input instruction system having a built-in feedback system.

3. The method as defined in claim 1, wherein the pulse control motor includes a rotation angle sensor having a pulse encoder in accordance with an incremental instruction.

4. The method as defined in claim 1, wherein the patterning mask receiving an attracting force generated by a magnetic field is disposed overlying a top surface of the substrate over which the electrode is formed, and a magnetic field source is disposed overlying a reverse surface of the substrate.

* * * * *